(12) United States Patent
Sekiguchi et al.

(10) Patent No.: US 10,641,607 B2
(45) Date of Patent: May 5, 2020

(54) HEIGHT DETECTION APPARATUS AND CHARGED PARTICLE BEAM APPARATUS

(71) Applicant: HITACHI HIGH-TECHNOLOGIES CORPORATION, Tokyo (JP)

(72) Inventors: Yoshifumi Sekiguchi, Tokyo (JP); Naoya Nakai, Tokyo (JP); Koichi Taniguchi, Tokyo (JP); Makoto Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/378,646

(22) Filed: Apr. 9, 2019

(65) Prior Publication Data
US 2019/0323835 A1   Oct. 24, 2019

(30) Foreign Application Priority Data
Apr. 20, 2018  (JP) ................ 2018-081420

(51) Int. Cl.
*G01C 5/00* (2006.01)
*H01J 37/22* (2006.01)
*H01J 37/21* (2006.01)
*H01J 37/244* (2006.01)

(52) U.S. Cl.
CPC ............... *G01C 5/00* (2013.01); *H01J 37/21* (2013.01); *H01J 37/226* (2013.01); *H01J 37/244* (2013.01); *H01J 2237/049* (2013.01); *H01J 2237/216* (2013.01); *H01J 2237/2448* (2013.01)

(58) Field of Classification Search
None
See application file for complete search history.

(56) References Cited

U.S. PATENT DOCUMENTS

| 7,423,266 B2* | 9/2008 | Tashiro ............. G01N 23/2251 250/306 |
| 2006/0060781 A1* | 3/2006 | Watanabe ............. B82Y 10/00 250/310 |
| 2007/0109557 A1 | 5/2007 | Saito et al. |
| 2009/0002695 A1* | 1/2009 | Saito .................. G01N 21/8806 356/237.4 |

(Continued)

FOREIGN PATENT DOCUMENTS

| JP | 2007-132836 A | 5/2007 | |
| WO | WO-2012153652 A1 * | 11/2012 | ............. G01B 15/00 |

*Primary Examiner* — Fernando Alcon
(74) *Attorney, Agent, or Firm* — Mattingly & Malur, PC

(57) ABSTRACT

A height detection apparatus is configured to project a pattern on a sample arranged at any of a plurality of reference positions and configured to detect a height of the sample. The apparatus includes: a projection optical system that generates a plurality of spatially separated light beams each having the pattern and projects the generated spatially separated light beams onto the sample; an imaging element that images the pattern reflected from the sample; a detection optical system that guides the pattern reflected from the sample to the imaging element; and at least one optical path length correction member disposed on an optical path different from an optical path having a shortest optical path length among a plurality of optical paths corresponding to the plurality of light beams at a position where the plurality of light beams is spatially separated.

12 Claims, 8 Drawing Sheets

(56) References Cited

U.S. PATENT DOCUMENTS

| | | | |
|---|---|---|---|
| 2011/0260055 A1* | 10/2011 | Wang | G01N 23/04 |
| | | | 250/307 |
| 2012/0051507 A1* | 3/2012 | Hasegawa | G01N 23/223 |
| | | | 378/44 |
| 2016/0203947 A1* | 7/2016 | Aoki | H01J 37/244 |
| | | | 250/307 |
| 2017/0343340 A1* | 11/2017 | Kawada | G01B 15/00 |
| 2017/0345614 A1* | 11/2017 | Kimura | H01J 37/222 |

* cited by examiner

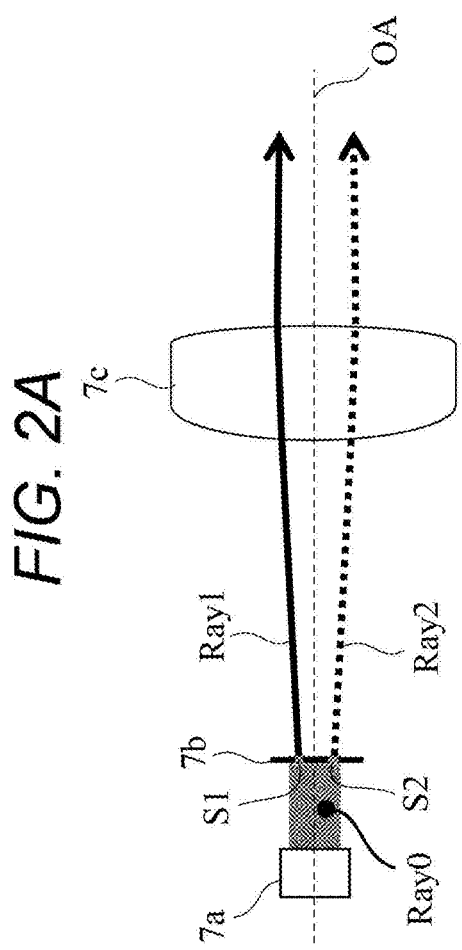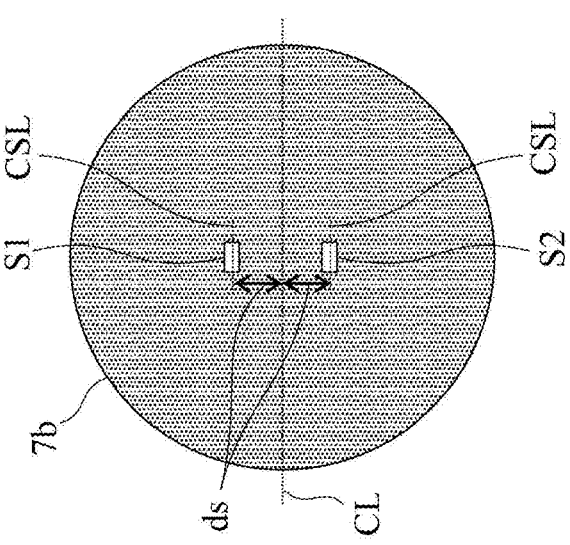

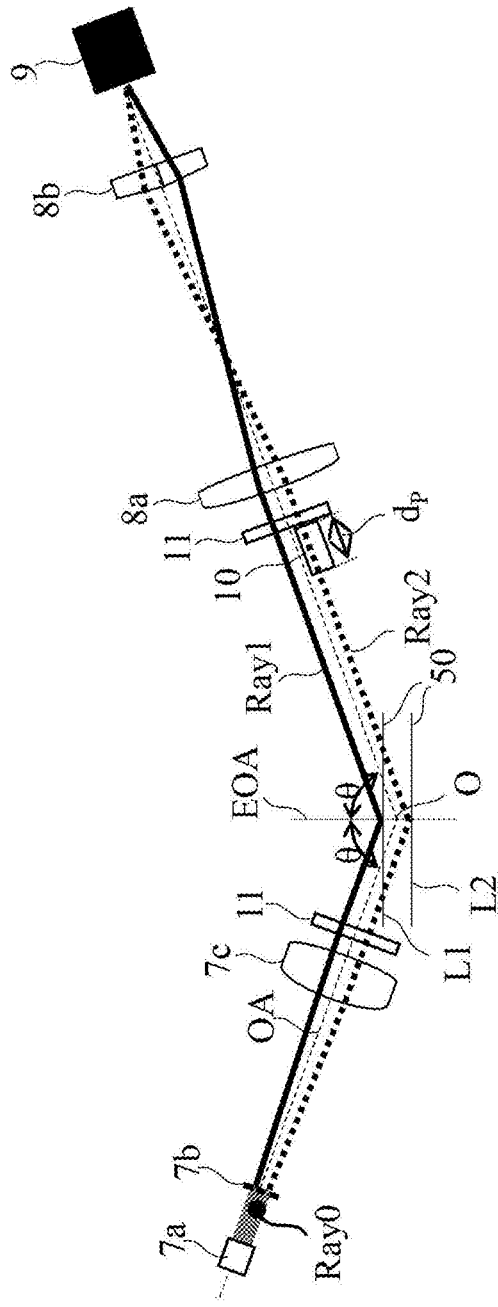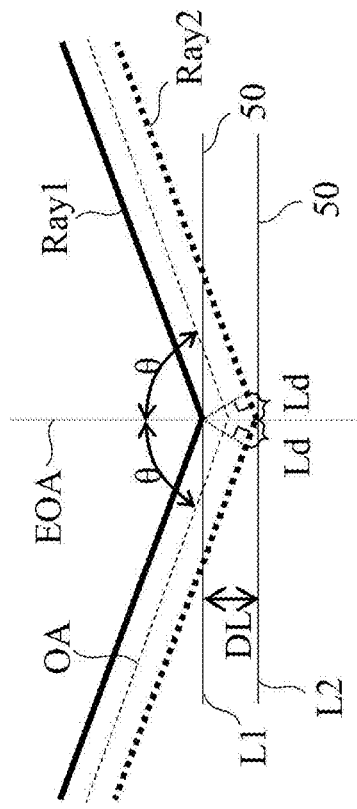
FIG. 4A
FIG. 4B

HEIGHT DETECTION APPARATUS AND CHARGED PARTICLE BEAM APPARATUS

CROSS-REFERENCE TO RELATED APPLICATION

The present application claims priority from Japanese application JP 2018-081420, filed on Apr. 20, 2018, the contents of which is hereby incorporated by reference into this application.

BACKGROUND OF THE INVENTION

1. Field of the Invention

The present disclosure relates to a height detection apparatus that optically detects a height of a sample and a charged particle beam apparatus including the height detection apparatus.

2. Description of the Related Art

There is a charged particle beam apparatus that detects charged particles secondarily obtained by emitting a charged particle beam such as an electron beam onto a sample. In the charged particle beam apparatus, it is necessary to adjust the focus of the charged particle beam to be emitted onto the sample to the sample.

Since operation of adjusting the focus of the charged particle beam to the sample needs high accuracy, fine adjustment of the height of a sample table is performed while observing the photographed image under illumination of the charged particle beam. At this time, in order to reduce the processing time of focusing, the height of the sample is quickly detected by an optical method before focusing is performed with the charged particle beam, so as to reduce the focusing processing by the charged particle beam.

JP 2007-132836 A describes an optical height detection method of projecting two-dimensional slit light onto a sample, detecting reflected light from the sample to detect the height of the sample from the detected two-dimensional slit image.

SUMMARY OF THE INVENTION

Meanwhile, the charged particle beam apparatus needs to increase the energy of the charged particle beam to be emitted to the sample in order to increase the resolution of the image. However, increasing the energy of the charged particle beam in order to finely observe deep holes or grooves opened in the sample such as a semiconductor wafer would make it difficult to focus the charged particle beam to one point on the sample because of limitation of the magnitude of the magnetic field for converging the charged particle beam onto the sample.

In this regard, the position at which the charged particle beam is focused is separated in a direction of propagation of the beam (that is, on the far side from the sample as viewed from the beam emitting device). That is, a charged particle beam with energy greater than a certain value has a limitation in condensing in a magnetic field, leading to a change in the focal position according to the energy of the charged particle beam.

However, the conventional optical height detection apparatus is a height detection apparatus with reference to a certain focal position, with little consideration of the necessity of detecting the height with respect to a plurality of focal positions. This makes it difficult to increase the energy of the charged particle beam beyond the limit for condensing by the magnetic field, and thus difficult to adjust the height of the sample with a single optical height detection apparatus when the focal position is changed.

The present disclosure has been made in view of the above points, and provides a technology capable of easily detecting a relative height of a sample from a plurality of reference positions.

In order to solve the above-described issue, there is provided is a height detection apparatus configured to project a pattern on a sample arranged at any of a plurality of reference positions and configured to detect a height of the sample from the reference position on the basis of the pattern reflected from the sample, the apparatus including: a projection optical system that generates a plurality of spatially separated light beams each having the pattern and projects the generated spatially separated light beams onto the sample; an imaging element that images the pattern reflected from the sample; a detection optical system that guides the pattern reflected from the sample to the imaging element; and at least one optical path length correction member disposed on an optical path different from an optical path having a shortest optical path length among a plurality of optical paths corresponding to the plurality of light beams at a position where the plurality of light beams is spatially separated.

According to the present disclosure, it is possible to easily detect a relative height of a sample from a plurality of reference positions. Problems, configurations, and effects other than in the above will become apparent by the description in the embodiments as follows.

BRIEF DESCRIPTION OF THE DRAWINGS

FIGS. 2A to 2C are views illustrating a specific configuration of a projection optical system;

FIGS. 4A and 4B are views illustrating an entire optical height detection apparatus;

DESCRIPTION OF THE PREFERRED EMBODIMENTS

Figure 1:
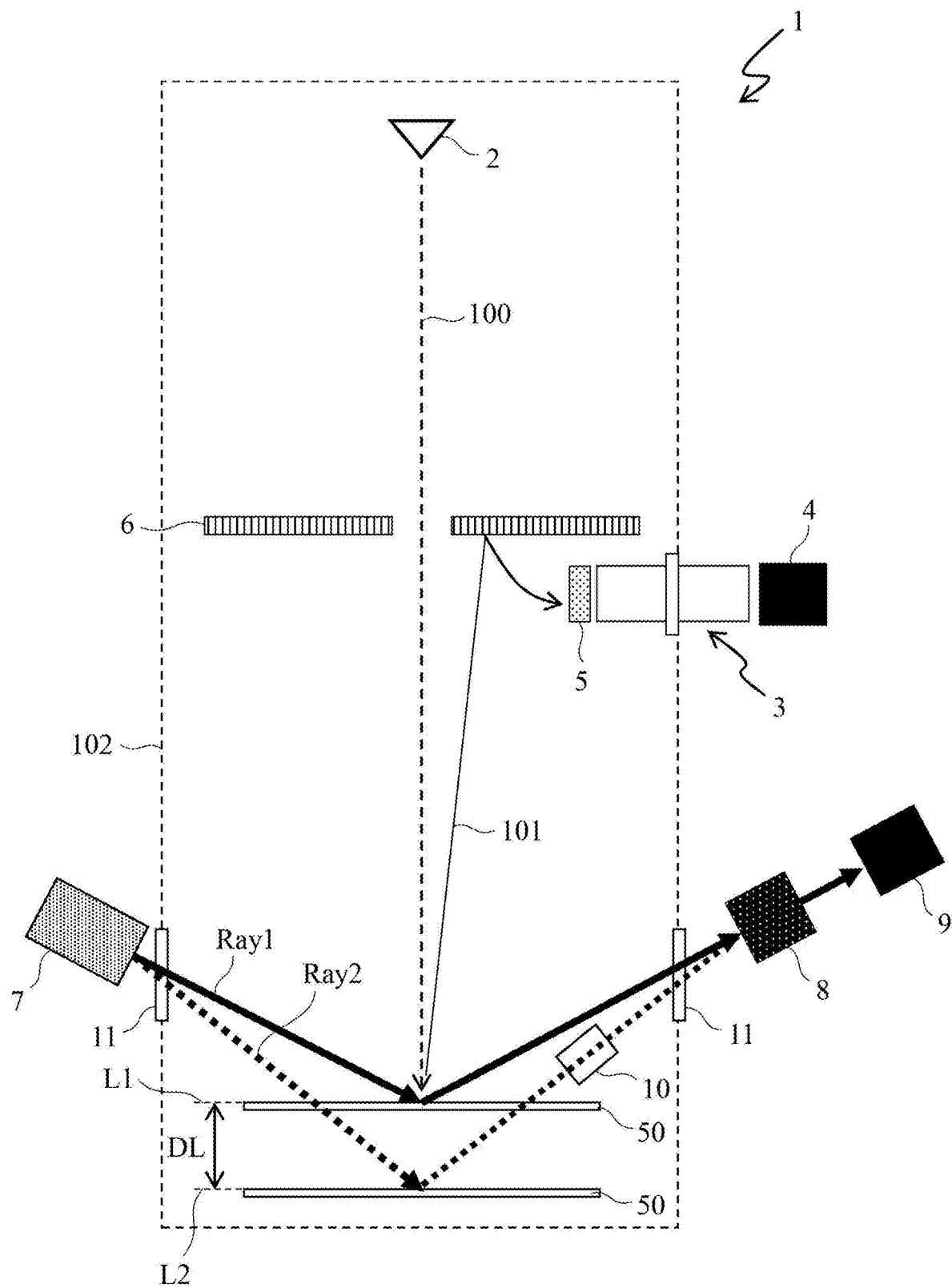
FIG. 1 is a view illustrating a basic configuration of an electron microscope to which an optical height detection apparatus according to a first embodiment is applied.

Hereinafter, embodiments of the present disclosure will be described with reference to the drawings. The embodiments of the present disclosure are not limited to the embodiments described below, and various modifications are possible within the scope of its technical concept. In addition, the same reference numerals are given to the corresponding portions in individual figures used in description of the embodiments to be described below, and redundant description will be omitted.

FIG. 1 is a view illustrating a basic configuration of an electron microscope 1 to which an optical height detection apparatus according to a first embodiment is applied. FIG. 1 illustrates a state where the sample 50 is at a position L1 or L2 in accordance with the energy of a primary electron beam 100. In the electron microscope 1, when the primary electron beam 100 emitted from an electron source 2 is applied on the sample 50, secondary particles 101 such as secondary electrons (electrons emitted from the sample itself) and reflected electrons are emitted.

First Embodiment

For simplicity, FIG. 1 illustrates trajectories of the primary electron beam 100 and the secondary particle 101 in a case where the sample 50 is at the position L1. Particles collided with a signal particle limiting plate 6 may be referred to as tertiary particles. However, to simplify the description, particles emitted from the sample 50 until being incident on a scintillator 5 will be referred to as secondary particles.

As described above, the secondary particles 101 collide with the signal particle limiting plate 6 so as to be incident on the scintillator 5. In the present description, the scintillator 5 is defined as an element that emits light when a charged particle beam is incident. The scintillator 5 is not limited to the one illustrated in the exemplary embodiment, but can take various shapes and structures. In the present embodiment, the scintillator 5 having a cylindrical outer shape will be described as an example.

When the secondary particle 101 is incident on the scintillator 5, light emission occurs in the scintillator 5. The light generated by the scintillator 5 is guided by a light guide 3 and converted into an electric signal by a photosensitive element 4. Hereinafter, the scintillator 5, the light guide 3, and the photosensitive element 4 may be collectively referred to as a detection system. The detection system is connected to a computer (not illustrated). The electric signal obtained by the photosensitive element 4 is converted into an image in association with an electron beam irradiation position and displayed on a display unit (not illustrated). This computer can execute a well-known image analysis algorithm to calculate the height of the sample.

Note that FIG. 1 omits illustration of an electron optical system (that is, a deflector, a lens, a diaphragm, an objective lens, etc.) for collecting and emitting the primary electron beam 100 on the sample. The electron optical system controls the traveling direction of the electron beam by applying a magnetic field to the primary electron beam 100. The electron beam output from the electron source 2 propagates with a certain spread in a direction perpendicular to the traveling direction of the beam. The electron optical system condenses an electron beam having a spread and emits the beam on one point (or a very small region) on a sample surface.

In a similar manner, FIG. 1 also omits illustration of a control unit (for example, a computer connected to the detection system) for controlling operation of the whole and each of components, a display unit for displaying an image, an input unit for inputting an operation instruction of the electron microscope by the user, or the like. The control unit also controls an actuator for changing the height of the sample stage on which the sample 50 is to be mounted. The optical height detection apparatus according to the present disclosure can also be applied to a transmission electron microscope, a scanning transmission electron microscope, or the like, in addition to the electron microscope 1.

When an accelerating voltage of the primary electron beam 100 exceeds a certain magnitude (for example, 10 keV), the primary electron beam 100 cannot be bent due to limitation of the magnitude of the magnetic field generated by the electron optical system. As a result, the position at which the primary electron beam 100 is condensed shifts in the direction in which electrons propagate (in a direction away from the electron source 2). The position L1 in FIG. 1 indicates a condensing position when the primary electron beam has a low energy (when output at a low accelerating voltage), while the position L2 indicates a condensing position at a high energy (when output at a high accelerating voltage).

The above is the description of the configuration of the electron microscope 1 illustrated in FIG. 1. Subsequently, an optical height detection apparatus included in the electron microscope 1 will be described. In the first embodiment, for the sake of simplicity, a case where there are two condensing positions will be described as an example.

As described above, the height of the sample 50 needs to be controlled such that the position of its surface matches the condensing position (focal position) of the primary electron beam 100. That is, in a case where the energy of the primary electron beam 100 is high and electrons cannot be bent by the electron optical system, the control unit controls the actuator so that the position of the sample 50 is adjusted to the position L2 illustrated in FIG. 1. In contrast, in a case where the energy of the primary electron beam 100 is low, the control unit controls the actuator so that the position of the sample 50 is adjusted to the position L1 illustrated in FIG. 1.

As described below, the optical height detection apparatus according to the present disclosure can easily detect, with a single imaging device, the height of the sample 50 from the reference position even in a case where the position of the sample 50 with respect to the optical height detection apparatus relatively changes. Methods for changing the relative position between the sample 50 and the optical height detection apparatus include a method of moving the sample 50 with respect to a fixed position of the optical height detection apparatus and a method of moving the electron optical system and the optical height detection apparatus with respect to a fixed position of the sample 50. Hereinafter, the present embodiment will be described by taking as an example a case of moving the sample 50 to change the relative position of the sample 50 with respect to the optical height detection apparatus.

In the case of using the electron microscope 1, the user brings the sample 50 in focus while imaging the sample 50 in order to adjust the position of the sample 50 to the condensing position. In a case where the position of the sample 50 is largely deviated from the focal position, this focusing would take time. Therefore, the height of the sample is initially detected at a high speed by an optical height detection apparatus so as to dispose the sample 50 at an approximate height, and then the sample 50 is brought in focus on the basis of the image captured by the electron microscope 1.

In the optical height detecting method described above, for example, a slit image is projected onto a surface of the sample 50, and the slit image reflected there is detected by the imaging element 9. A height detection algorithm executed by the computer connected to the detection system detects the height of the sample 50 on the basis of the amount of deviation of the captured slit image from the reference position in the image.

An optical height detection apparatus for implementing the above optical height detecting method includes a projection optical system 7, a detection optical system 8, an imaging element 9, and an optical path length correction member 10. The optical height detection apparatus according to the first embodiment detects a relative height from each of the condensing positions L1 and L2, with each of which being defined as reference. A height difference DL between the condensing positions L1 and L2 is about 0.5 mm to 10 mm, for example, although it is not particularly limited. The height in the range of about ±0.1 mm from each reference position is measured by the optical height detection apparatus. Until the height of the sample 50 falls within a height detectable range by the optical height detection apparatus, the control unit adjusts the height of the stage (not illustrated) that conveys the sample 50 by using another height sensor.

The projection optical system 7 is an optical system that outputs two light beams Ray 1 and Ray 2. The detection optical system 8 is an optical system that guides the light beam reflected by the sample 50 to the imaging element 9. The projection optical system 7 and the detection optical system 8 are configured such that the light beam Ray 1 reflected by the sample 50 is imaged on the imaging element 9 in a case where the sample 50 is at the condensing position L1, while the light beam Ray 2 would not reach the imaging element 9 after being reflected by the sample 50 (such that the reflected light beam Ray 2 is to be shielded by one of members constituting the electron microscope 1, for example). In contrast, the projection optical system 7 and the detection optical system 8 are configured such that the light beam Ray 2 reflected by the sample 50 is imaged on the imaging element 9 in a case where the sample 50 is at the condensing position L2, while the light beam Ray 1 would not reach the imaging element 9 after being reflected by the sample 50.

Furthermore, a region where the primary electron beam 100 propagates in the electron microscope 1 needs to be a vacuum. In FIG. 1, a broken line 102 is a line separating a vacuum region and an atmospheric pressure region. The electron microscope 1 according to the present embodiment disposes the projection optical system 7, the detection optical system 8, and the imaging element 9 in the atmosphere, projects light beams Ray 1 and Ray 2 onto the sample 50 through a vacuum sealing window 11, and detects the reflected light. Since it is sometimes necessary to fine-tune the optical system, it is desirable to arrange the optical system as much as possible outside the vacuum. That is, arranging the projection optical system and the detection optical system outside the vacuum would facilitate fine tuning of these optical systems.

FIGS. 2A to 2C are views illustrating a specific configuration of the projection optical system 7. FIG. 2A is a cross-sectional view illustrating an overall configuration of the projection optical system 7. A light beam Ray 0 output from a light source 7a such as a laser or an LED is divided into two light beams Ray 1 and Ray 2 at a slit portion 7b. Each of the two light beams Ray 1 and Ray 2 is a light beam having an image pattern (slit image) by a finer slit group S1 and S2 to be described below. Hereinafter, an image pattern may be simply referred to as an image or a pattern. The two light beams output from the light source 7a pass through the projection lens system 7c and are projected as a slit image on the sample. In FIG. 2A, a broken line OA represents the optical axis.

Methods of emitting a plurality of light beams from the projection optical system 7 include, for example, a method using a plurality of light sources and a slit corresponding to each of the light sources, and a method using a plurality of light sources of lasers or the like, in addition to the above-described configuration example. The projection optical system 7 is sufficient as long as it is capable of generating a plurality of spatially separated light beams. Still, as a method of generating a plurality of light beams, the method of separating the light output from one light source 7a illustrated in FIGS. 2A to 2C into a plurality of light beams at the slit portion 7b would be advantageous in its small number of components. Furthermore, since this method uses a small number of components, there are fewer positions that need adjustment in the optical system, leading to less positional deviation points, and this would achieve an effect of stabilizing the performance of the optical system. Note that "a plurality of light beams being spatially separated" means that the optical paths of a plurality of light beams would not spatially overlap with each other at least partially.

FIG. 2B is a front view of the slit portion 7b. The slit portion 7b is a member formed by patterning a metal thin film on a glass substrate. A region without a metal thin film is a region through which light passes and corresponds to a slit S (FIG. 2C). The slit portion 7b forms the slit groups S1 and S2 by a plurality of slits S (a rectangular region without a metal thin film).

The slit groups S1 and S2 are symmetrically arranged with respect to a line CL passing through the center of the slit portion 7b. Center lines CSL of the two slit groups S1 and S2 are located at a distance ds equal from the center line CL. Hereinafter, the present embodiment will be described by using an example of the slit groups S1 and S2 formed by aligning four rectangular slits S as illustrated in FIG. 2C. Note that the present disclosure does not limit the shape of the slit S and the number of slits included in the slit group.

In FIG. 1 and FIGS. 2A to 2C, the light beam transmitted through the slit group S1 is the light beam Ray 1, and the light beam transmitted through the slit group S2 is the light beam Ray 2. Accordingly, images of four slits S are projected on the surface of the sample and formed on the imaging element 9. The electron microscope 1 detects the height of the sample 50 on the basis of a centroid position of brightness intensity distribution of images (four slit images) obtained by the imaging element 9.

While various images other than the slit image are usable for the image used for height detection, a slit image is one of the simplest images usable for height detection. Using a simple image facilitates processing of detecting the height from the obtained image, leading to improvement of the measurement speed.

Hereinafter, the reason for measuring, in the present embodiment, the height by using the slit group S1 or S2 including four slits rather than a single slit will be described. Normally, the reflectance of the surface of the sample 50 is not uniform, and the reflectance varies depending on a position of the surface. (For example, in a case where the sample 50 is a semiconductor wafer, the reflectance of a wiring portion differs from the reflectance of a silicon portion.) This non-uniformity of the reflectance causes an error at the time of performing height detection on the basis of the position of the centroid of the image brightness.

Using a plurality of slits rather than a single slit to perform height detection would be able to reduce the error in height detection due to non-uniformity of reflectance distribution. This is because, in the height detection calculated from the centroid of the intensity distribution of the brightness of the image obtained by the imaging element 9, using a single slit might be influenced by the reflectance distribution of the sample 50, leading to deviation of the centroid of the intensity distribution from a correct position, whereas using a plurality of slits would reduce the positional deviation of the centroid, resulting in reduction of the error in height detection.

The projection lens system 7c often includes a plurality of lenses for correcting aberrations or the like. However, the present embodiment will be described by taking a single lens configuration as an example, for the sake of simplicity. Note that the present disclosure does not limit the configuration of the projection lens system 7c. The projection lens system 7c enlarges the slit image by $m_0$ times to be formed on a surface of the sample 50. Here, the center of the slit portion 7b and the center of the projection lens system 7c pass through the optical axis OA.

Figure 3A:
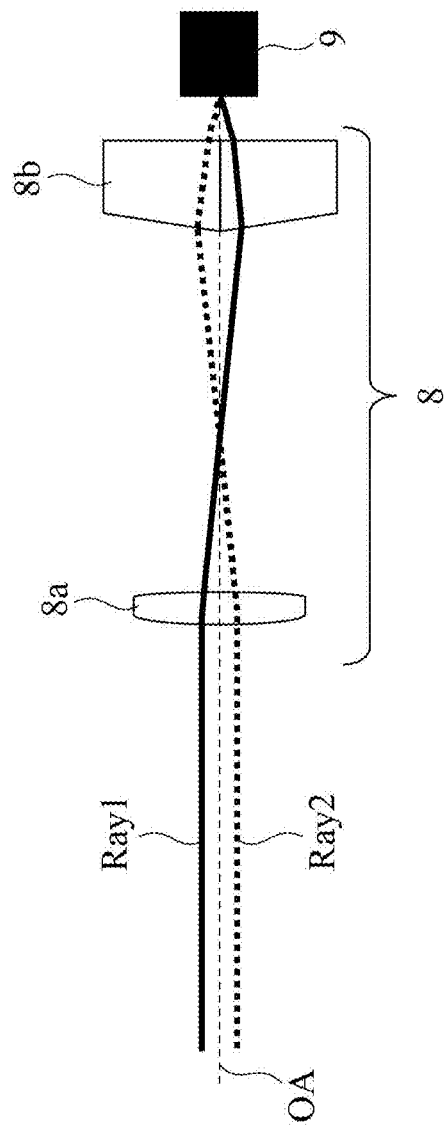
FIGS. 3A and 3B are views illustrating a specific configuration of a detection optical system.
Figure 3B:
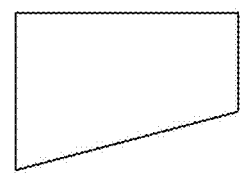

FIGS. 3A and 3B are views illustrating a specific example of the detection optical system 8. FIG. 3A illustrates a cross-sectional view of the detection optical system 8. FIG. 3B illustrates an enlarged view of a refractive member 8b. The detection optical system 8 is an optical system that guides the light beams Ray 1 and Ray 2 reflected by the sample 50 to the imaging element 9. The detection optical system 8 in the present embodiment includes a detection lens system 8a and the refractive member 8b. The detection optical system 8 is not limited to this configuration as long as it is an optical system that guides the light beams Ray 1 and Ray 2 reflected by the sample 50 to the imaging element 9.

The detection lens system 8a often includes a plurality of lenses for correcting aberrations or the like. However, the present embodiment will be described by taking a single lens configuration as an example, for the sake of simplicity. Note that the present disclosure does not limit the configuration of the detection lens system 8a. The detection lens system 8a multiplies the slit image reflected by the sample 50 by m to form an image on the imaging element 9.

The light beams Ray 1 and Ray 2 are light beams generated from slit groups S1 and S2 each being separated from the optical axis OA by the distance ds. This distance ds is enlarged by the projection lens system 7c and the detection lens system 8a by about $m_0 \times m$, often resulting in formation of the images of the slit groups S1 and S2 outside the light receiving surface of the imaging element 9. There is another disadvantage of ineffectiveness in the use of the imaging element 9 since the image would deviate from the center even when the image is formed on the light receiving surface.

To manage this, the detection optical system 8 includes the refractive member 8b arranged so that each of light beams is refracted to form an image at the center of the imaging element 9. A specific example of the refractive member 8b is a wedge substrate (or a prism). The wedge substrate is a transparent substrate and is a prism to refract light beams, namely, the light beams Ray 1 and Ray 2 toward the center of the imaging element 9.

FIG. 3B illustrates a cross-sectional shape of the wedge substrate constituting the refractive member 8b. The cross-sectional shape is thick on one end and gradually becomes thinner toward the other end. The refractive member 8b illustrated in FIG. 3A has a configuration in which two wedge substrates illustrated in FIG. 3B are arranged symmetrically while being in contact with each other corresponding to the light beams Ray 1 and Ray 2.

The wedge substrate (or prism) is a simplest example of the refractive member 8b. Due to the simple shape of the wedge substrate, it is easy to obtain a member with a machined surface with high precision with high arrangeability in the optical system. Therefore, using the wedge substrate in the optical system would make it possible to suppress deterioration in performance due to variations such as positional deviation. The refractive member 8b is not limited to a wedge substrate and may be any member as long as it has a function of refracting a slit image and forming an image on the center of the imaging element 9.

Examples of the imaging element 9 include an image sensor capable of capturing an image, such as a charge coupled device (CCD) or a complementary metal oxide semiconductor (CMOS). The center axis of the detection lens system 8a and the center axis of the imaging element 9 match the optical axis OA.

FIGS. 4A and 4B are views illustrating an entire optical height detection apparatus. Hereinafter, the entire optical system and the optical path length correction member 10 will be described in detail with reference to FIG. 4A. In this system, a height change amount $\Delta Z$ of the sample 50 is calculated by the following Formula (1) using a movement amount $\Delta S$ of a slit image in the imaging element 9, the projection (detection) angle θ of the light beam, and the magnification m of the detection lens system 8a. A computer connected to the detection optical system 8 detects a change in the height of the sample 50 on the basis of the movement amount $\Delta S$ of the slit image.

[Mathematical Formula 1]

$$\Delta Z = \frac{\Delta S}{2m \sin \theta} \quad (1)$$

The optical height detection apparatus uses an arrangement in which the optical axis OA becomes a path reflected at an intermediate position between the reference positions L1 and L2 (hereinafter referred to as an origin O). In other words, the optical height detection apparatus has a configuration that allows the slit groups S1 and S2 in the slit portion 7b to be disposed symmetrically with respect to the center (position where the optical axis OA passes) of the slit portion 7b and that allows the optical axis OA to pass through a path reflected at an intermediate position between the reference positions L1 and L2 of the height of the sample.

With this configuration of the optical height detection apparatus, the light beam Ray 1 that has passed through the slit group S1 is applied to the center of the sample 50 (position on which the optical axis EOA of the electron optical system passes through the sample 50) when the height of the sample 50 is at the position L1, while the light beam Ray 2 that has passed through the slit group S2 is applied to the center of the sample 50 when the height of the sample 50 is at the position L2.

In general, aberration of the lens system in the light beam propagating in the vicinity of the optical axis is small. Accordingly, the optimum image can be obtained when the sample is observed with the light beam propagating in the vicinity of the optical axis. The above configuration of the optical height detection apparatus has a configuration of minimizing a maximum value of the deviation of the light beam Ray 1 or Ray 2 from the optical axis OA, being a maximum value of the deviation of all light beams from the optical axis OA. This makes it possible to reduce an error in height detection in a case where the sample 50 is located at any of the positions L1 or L2.

In the present embodiment, introducing the optical path length correction member 10 as described below would make the optical paths of the light beams Ray 1 and Ray 2 from the slit portion 7b to the imaging element 9 symmetrical with respect to the optical axis OA (refer to FIG. 4A). In other words, the effective optical path lengths of the light beams Ray 1 and Ray 2 are equalized. Therefore, as described above, the shape of the refractive member 8b can be a shape or a configuration symmetrically arranged in a state where two wedge substrates are adjacent to each other.

Adopting an identical member for the light beams Ray 1 and Ray 2 would reduce mounting errors of the wedge substrate and troublesome adjustment of the optical system, so as to facilitate assembly. As a result, it is possible to reduce the assembling time of the optical height detection apparatus and suppress the performance deterioration due to the assembling error.

As described above, the projection lens system 7c and the detection lens system 8a are set so as to form an image on the imaging element 9 at predetermined magnifications $m_0$ and m, respectively, when light propagates in the vicinity of the optical axis OA. In a case where the optical path length correction member 10 for effectively reducing the optical path length of the light beam Ray 2 is not used as opposed to the optical height detection apparatus according to the embodiment, the light beam Ray 1 (output from the slit group S1) and the light beam Ray 2 (output from the slit group S2) would be reflected by the sample 50 located at the positions L1 and L2, respectively, and the light beams Ray 1 and Ray 2 are incident on the detection lens system 8a in a state where there is a difference in the optical path lengths of the two light beams. This might lead to an issue that the magnifications of an image and the imaging positions on the optical axis (distance from the origin O to the imaging position along the optical axis OA, that is, the distance from the origin O to the imaging element 9) differ between the light beams Ray 1 and Ray 2.

In a case where the imaging positions differ between light beams Ray 1 and Ray 2, two imaging elements 9 would be needed, leading to the necessity of providing an optical system for guiding light to each of the imaging elements 9. In addition, in a case where the magnifications of the image differ between the light beam Ray 1 and the light beam Ray 2, a height detection algorithm matching each of the magnifications would be needed. Additionally, in a case where the magnification of the image is reduced, the resolution of the slit image would be degraded due to limitation of the resolution of the imaging element 9. Since the height detection algorithm detects the height of the sample on the basis of the centroid of the intensity distribution of the slit image, the reduction in the resolution of the slit image leads to a degradation in accuracy of the height detection. In order to solve these issues, the optical height detection apparatus according to the present disclosure introduces the optical path length correction member 10 into the path of the light beam Ray 2 having a longer optical path.

Hereinafter, the cause of deviation in magnification of the slit image and the imaging position will be described with reference to FIG. 4B. An optical system of the present embodiment has a configuration in which the optical axis, and the light beams Ray 1 and Ray 2 are substantially parallel to each other in the vicinity of the origin O. This is to facilitate the optical path length correction described below with a simplified optical system. More specifically, this configuration is adopted so as to spatially separate the light beams Ray 1 and Ray 2 and to dispose the optical path length correction member 10 on one optical path alone.

As illustrated in FIG. 4B, the light beam Ray 2 has a longer optical path than the light beam Ray 1 by 2Ld (≈2DL cos θ). In general, a lens is defined by the a lens image formation formula represented by the following Formula (2) between a distance 11 between an object point and a front principal point in a lens system, a distance 12 between a rear principal point and an image point in the lens system, and a focal length f, and the magnification of the image is represented by $l_2/l_1$.

[Mathematical Formula 2]

$$\frac{1}{l_1} + \frac{1}{l_2} = \frac{1}{f} \quad (2)$$

Accordingly, an increase in the optical path (optical path length $l_1$) in front of the detection lens system 8a would reduce the optical path from the detection lens system 8a to the imaging position (optical path length $l_2$), leading to reduction of the magnification of the image. In other words, the imaging position in the light beam Ray 2 becomes closer to the origin O than in the light beam Ray 1, and this also reduces the slit image formed on the imaging element 9. A reduction in the slit image would decrease the resolution, leading to degradation in the height detection accuracy.

To cope with this, the optical height detection apparatus according to the present disclosure has a configuration that enables the effective optical path length of the light beam Ray 2 having a longer optical path to be corrected by the optical path length correction member 10, so as to allow the magnification and the imaging position (distance from the origin O along the optical axis OA) to be adjusted to the light beam Ray 1 so as to enable detection of a plurality of heights with a predetermined detection accuracy using one imaging element 9. Hereinafter, a method of correcting the light beam Ray 2 having a long optical path will be described with reference to FIG. 5.

Figure 5:
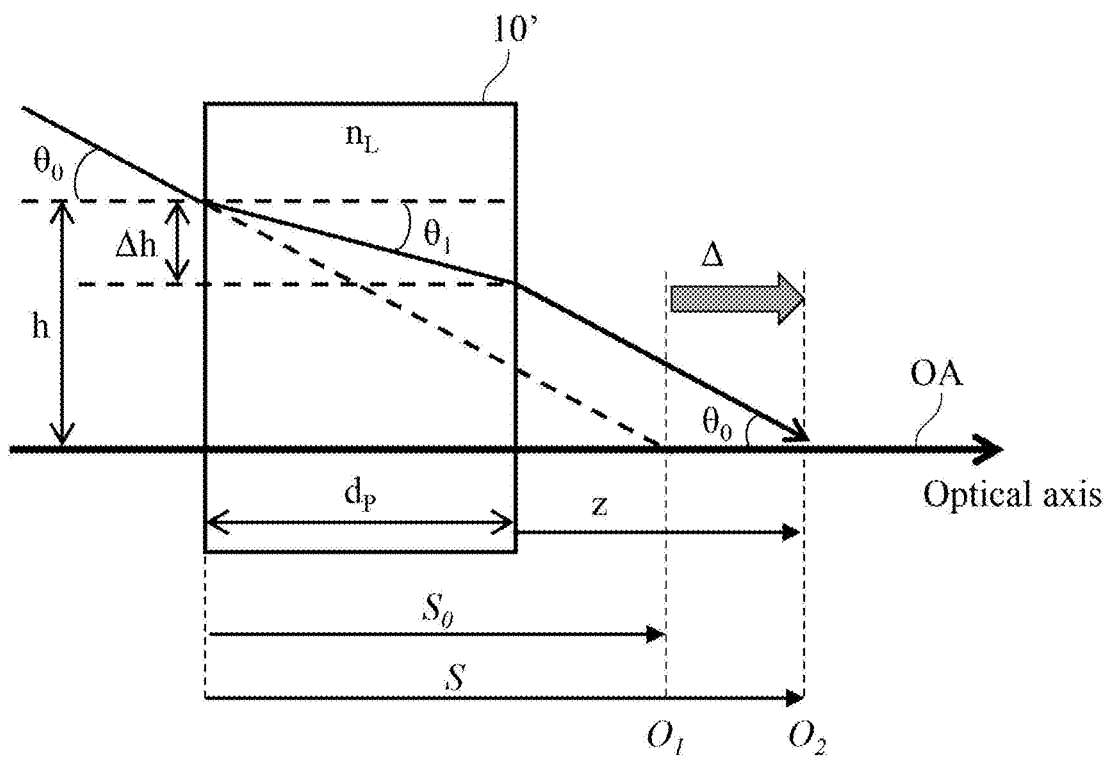
FIG. 5 is a view illustrating a state in which an optical path of a light beam is changed by an optical path length correction member.

FIG. 5 is a view illustrating a state in which an optical path of a light beam is changed by the optical path length correction member 10. The optical path length correction member 10 is a transparent member and is, for example, glass or acrylic block or prism. The optical path length correction utilizes a deviation of the imaging position due to the presence of a transparent member (a transparent parallel flat plate 10' in FIG. 5) in the optical path.

FIG. 5 illustrates a state where the imaging position translates in a propagation direction of the light beam by A in a case where the parallel flat plate 10' having a thickness $d_P$ and a refractive index $n_L$ is installed in the optical path. The light beam reaches a position $O_1$ in the absence of the parallel flat plate 10'. However, due to the presence of the parallel flat plate 10', the arrival position of the light beam translates by A so as to allow the light beam to reach a position $O_2$. A geometrical relationship leads to equations of $S=d_P+z=d_P+(h-\Delta h)/\tan \theta_0$ and $S_0=h/\tan \theta_0$. Accordingly, the movement amount $\Delta=S-S_0$ is obtained by the following Formula (3).

[Mathematical Formula 3]

$$\Delta = \left(1 - \frac{\tan\theta_1}{\tan\theta_0}\right)d_P = \left(1 - \frac{\sin\theta_1\cos\theta_0}{\sin\theta_0\cos\theta_1}\right)d_P \cong \left(1 - \frac{1}{n_L}\right)d_P \quad (3)$$

In Formula (3) above, Δ is approximated using Snell's law and approximate expression of paraxial optical cos θ 0≈1.

As described above, the transparent parallel flat plate 10' having the thickness $d_P$ is installed in the optical path, thereby allowing the optical path to translate by Δ in the propagation direction. Therefore, in a case where the optical path difference between the light beams Ray 1 and Ray 2 is Δ, the thickness $d_P$ is calculated on the basis of Formula (3). A transparent member with the thickness $d_P$ is installed in the longer optical path so as to be able to effectively match the optical path lengths of the two light beams.

FIG. 4A illustrates an example of installing a glass rod (columnar glass) being a transparent member as the optical path length correction member 10 in the optical path of Ray 2 having a longer optical path. Here, the length of the glass rod is the thickness $d_P$ calculated by Formula (3). The glass rod of the optical height detection apparatus of the embodiment is disposed adjacent to the vacuum sealing window 11 on the detection side and the glass rod is also secured by an identical member that secures the vacuum sealing window 11 at the same time The component to secure the vacuum sealing window 11 is shared to secure the glass rod in this manner, making it possible to reduce the number of components and to simplify the assembly of the apparatus.

The optical path length correction member 10 illustrated in FIG. 4A has a shape such that the incident surface and the output surface are parallel to each other and is formed with a transparent glass rods, which is an example of the simplest optical path length correction member. The optical path length correction member 10 is easy to produce and can be easily disposed in a straight optical path. The high arrangeability of the optical path length correction member 10 would simplify the adjustment of the optical system, leading to suppression of degradation in performance caused by positional deviation or the like of the components of the optical height detection apparatus. The optical path length correction member 10 does not necessarily have to have the incident surface and the output surface parallel to each other, and the incident surface and the output surface may be inclined surfaces.

Introducing the optical path length correction member 10 and equalizing the effective optical path length between the light beams Ray 1 and Ray 2 also make it possible to equalize imaging positions (distances from the origin O along the optical axis OA to the imaging position). In other words, the magnification of the slit group is equalized between the light beams Ray 1 and Ray 2. Furthermore, since imaging positions of the light beams Ray 1 and Ray 2 are the same, disposing the refractive member 8b having the shape illustrated in FIG. 4A would make it possible to focus the light beams Ray 1 and Ray 2 at one point on the optical axis. This means that, with the use of one secured imaging element 9, it is possible to detect the height of two references (any of the positions L1 or L2 as the height of the sample 50).

That is, the present embodiment has a configuration in which the projection optical system 7 generates a plurality of spatially separated light beams and the optical path length correction member 10 is introduced to the optical path having a longer optical path (optical path other than the optical path having the shortest optical path length) at a position where the plurality of spatially separated light beams is spatially separated. With this configuration, it is possible to achieve an effect of obtaining matching between the imaging positions of the plurality of light beams and matching the magnifications of the slit images.

Moreover, the optical detection apparatus of the embodiment has a configuration of disposing the refractive member 8b in the detection optical system 8, thereby outputting the light beam incident from a plurality of optical paths toward one imaging element 9. Adopting this configuration of the optical detection apparatus makes it possible to suppress the number of the imaging element 9 to one, and thus possible to suppress complication of the optical system. This leads to effects of reduction in adjustment of optical members, and suppression of degradation of the performance due to positional deviation or the like.

As a result of examination by the inventors, the effect of the optical path correction is obtained even with a slight deviation of the thickness $d_P$ of the glass rod from the value of Formula (3). Specifically, the contrast of the slit is resolved at a desired magnification and an imaging position even when the thickness of the optical path length correction member 10 deviates from the value calculated by Formula (3) by about ±50%. Accordingly, installing, within an optical path, the transparent optical path length correction member 10 having a thickness designed to be within an appropriate range would be likely to obtain a desired function as an optical height detection apparatus. In contrast, when setting the thickness of the optical path length correction member 10 to the value calculated by Formula (3), it is possible to obtain a clearer slit image.

Furthermore, while installing the optical path length correction member 10 on the light source 7a side with respect to the detection lens system 8a enables correction of both the magnification and the imaging position, installing the optical path length correction member 10 on the imaging element 9 side with respect to the detection lens system 8a would also enable correction of the imaging position.

Modification of First Embodiment

The optical height detection apparatus of the first embodiment disposes the optical path length correction member 10 having thickness designed on the basis of Formula 3 on the detection optical system 8 side with respect to the sample 50. As the optical path length correction member, it is allowable to prepare two optical path length correction members 40 each having a thickness of half the thickness $d_P$ determined by Formula (3) and then it is allowable to install the optical path length correction member 40 both on the projection optical system 7 side with respect to the sample 50 and on the detection optical system 8 side with respect to the sample 50.

Figure 6:
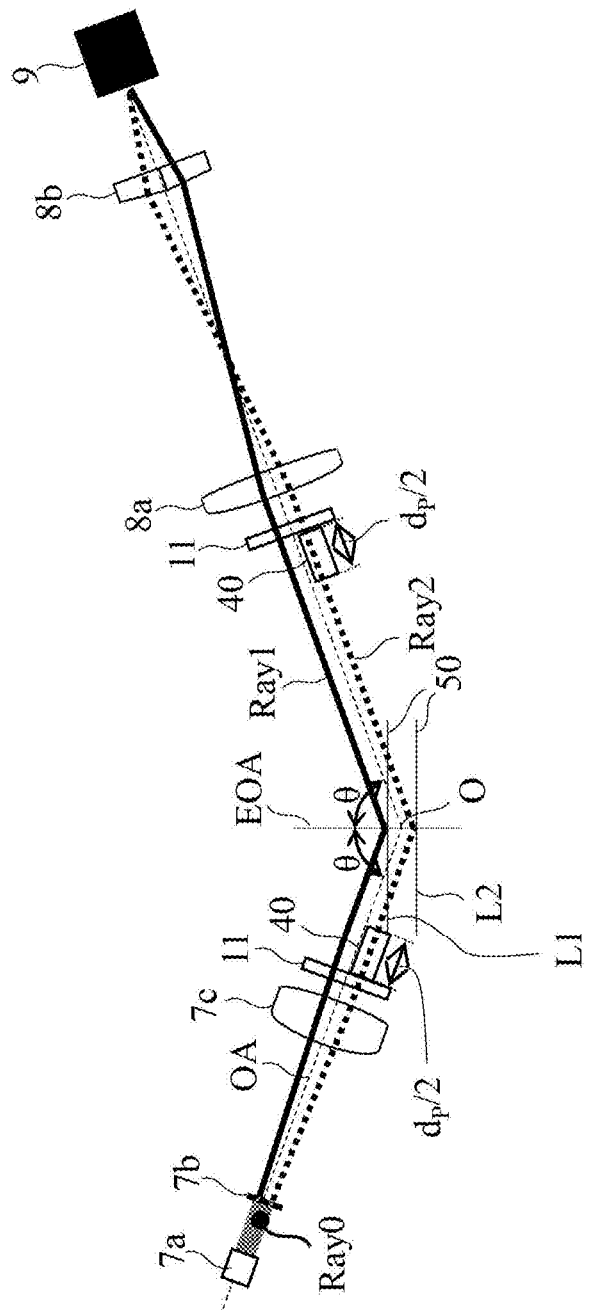
FIG. 6 is a view illustrating an optical height detection apparatus according to a modification of the first embodiment.

FIG. 6 is a view illustrating an optical height detection apparatus according to the present modification. The optical height detection apparatus according to the present modification is different from the optical height detection apparatus according to the first embodiment in design and arrangement of the optical path length correction member(s). As described above, the optical path length correction member 40 of the present modification has a thickness of half the thickness $d_P$ determined by Formula (3), and is located on the optical path of the light beam Ray 2 on two sides with respect to the optical axis EOA of the electron optical system.

With this configuration, the optical path lengths from the light source 7a to the sample 50 effectively equalized between the light beams Ray 1 and Ray 2, enabling the light beams Ray 1 and Ray 2 to be imaged on the sample 50. Therefore, unlike the case where the optical path length is corrected solely by the detection optical system 8 side of the sample 50, the height detection of the sample 50 can be executed with higher accuracy.

Second Embodiment

Figure 7:
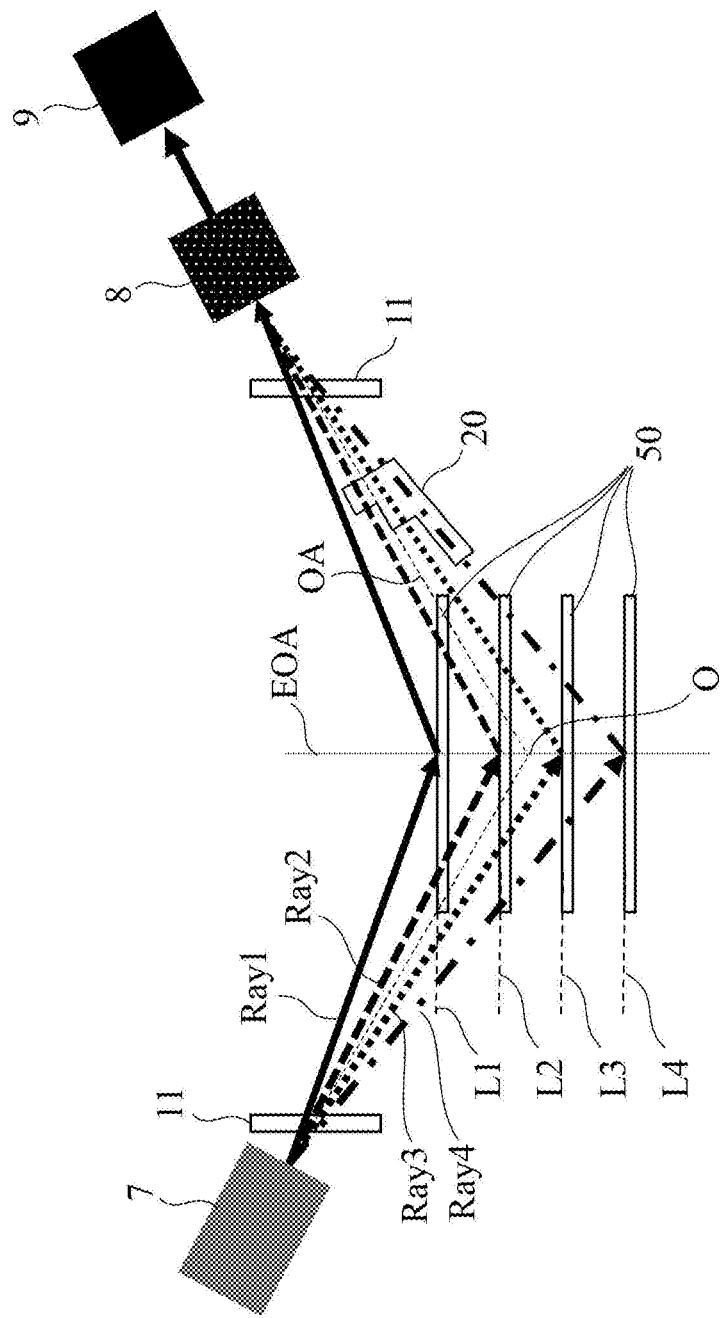
FIG. 7 is a view illustrating an optical height detection apparatus according to a second embodiment.

FIG. 7 is a view illustrating an optical height detection apparatus according to a second embodiment. Descriptions of the same portions as those of the first embodiment or portions having the same function will be omitted. In addition, portions having the same reference numerals in the figures are portions having similar functions.

The optical height detection apparatus of the second embodiment has four positions each being reference heights of the sample 50, namely the positions L1 to L4, and detects a relative height from each of reference positions. Hereinafter, an intersection of the optical axis EOA of the electron optical system and the optical axis OA is defined as the origin O.

The projection optical system 7 is an optical system that outputs four light beams Ray 1 to Ray 4. The detection optical system 8 is an optical system that guides the light beams reflected by the sample 50 to the identical imaging element 9. The four light beams have longer optical path lengths in the order of the light beams Ray 2, Ray 3, and Ray 4, with respect to the light beam Ray 1. Therefore, in order to equalize the magnification of the slit image captured by the imaging element 9 and the imaging position (distance from the origin O along the optical axis to the imaging position), the optical path length correction member 20 need to be used to effectively align the optical path length of the light beam Ray 1 and the optical path length of other light beams.

As illustrated in the above Formula (3), the optical path length $\Delta$ to be corrected and the distance of propagation in the optical path length correction member 20 (thickness $d_P$ in the case of a parallel flat plate) are in a proportional relationship. Accordingly, the distance of propagation in the optical path length correction member 20 needs to be increased in the order of the light beams Ray 2, Ray 3, and Ray 4.

The optical path length correction member 20 illustrated in FIG. 7 has such a shape that each of light beams is incident substantially perpendicularly to the incident surface and is output substantially perpendicularly from the output surface. As described above, the distance of propagation in the optical path length correction member 20 needs to be increased in the order of the light beams Ray 2, Ray 3, and Ray 4. To achieve this, the cross-sectional shape of the optical path length correction member 20 is close to a stepped shape.

That is, the optical height detection apparatus according to the second embodiment includes a plurality of optical paths corresponding to a plurality of light beams output from the projection optical system 7, and disposes, for each of the optical paths, the optical path length correction member 20 in a stepped shape elongated corresponding to the increase in the optical path length on the basis of the shortest optical path. With this configuration, the optical height detection apparatus according to the second embodiment can equalize the magnification and the imaging position of the slit image of each of the plurality of light beams.

As described above, similarly to the first embodiment, the second embodiment also has a configuration of disposing the optical path length correction member 20 in the optical path other than the optical path having the shortest optical path length at the position where a plurality of optical paths is spatially separated.

Furthermore, similarly to the first embodiment, installing the optical path length correction member 20 on the light source side with respect to the detection lens system 8a enables correction of both the magnification and the imaging position, while installing the optical path length correction member 20 on the imaging element 9 side with respect to the detection lens system 8a would also enable correction of the imaging position.

Modification of Second Embodiment

The optical height detection apparatus according to the second embodiment has a configuration in which four light beams are received by one imaging element 9. The optical height detection apparatus may emit a larger number of light beams and may use two or more imaging elements 9 to detect the height of the sample 50.

For example, the optical height detection apparatus may be configured such that the projection optical system 7 outputs six light beams, and two imaging elements 9 are prepared, and then, three of the six light beams are to be incident on each different one of the imaging elements 9. In that case, the optical path length correction member 20 that is elongated corresponding to the increase in the optical path length is disposed corresponding to each of the optical paths with reference to the short optical path among the light beams incident on the identical imaging element 9. With this configuration, the magnification of the slit image and the imaging position can be equalized.

Third Embodiment

Figure 8A:
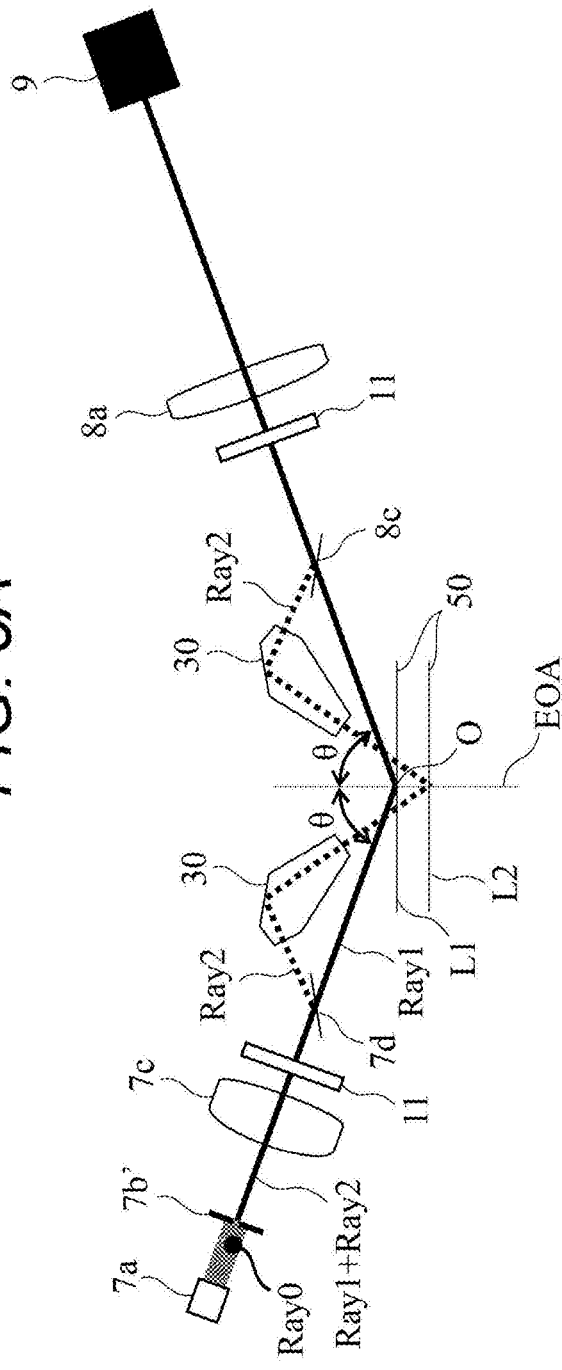
FIGS. 8A to 8C are views illustrating an optical height detection apparatus according to a third embodiment.
Figure 8C:
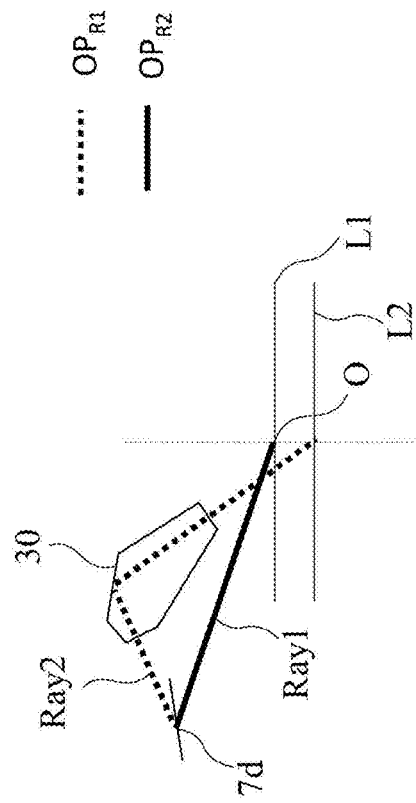
Figure 8B:
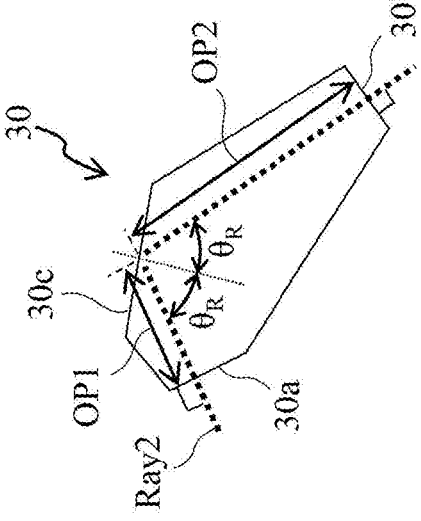

FIGS. 8A to 8C are views illustrating an optical height detection apparatus according to a third embodiment. Description of the same portions as those of the first embodiment or portions having the same function will be omitted. In the drawings, the same reference numerals are those having similar functions.

FIG. 8A is a view illustrating an entire optical system of the optical height detection apparatus according to the third embodiment. The third embodiment is different from the first embodiment in a method of separating a light beam into a plurality of light beams in the projection optical system 7. In the third embodiment, a half mirror 7d is used instead of the plurality of slit groups in order to separate a light beam into a plurality of light beams in a projection optical system 7'. The half mirror 7d is an optical member that partially reflects the light while transmitting the remaining light.

In FIG. 8A, a light beam to detect the height with reference to the position L1 of the height of the sample 50 is the light beam Ray 1, that is a light beam that passes through the half mirror 7d and propagates in the vicinity of the optical axis. In FIG. 8A, the optical axis OA matches the optical path of the light beam Ray 1. The light beam Ray 2 is a light beam branched from the light beam Ray 1 by the half mirror 7d and reflected by an optical path length correction member 30 described below.

In the optical height detection apparatus according to the third embodiment, a slit portion 7b' has only one slit group S1 illustrated in FIGS. 2A and 2B at the center through which the optical axis OA passes, and after passing through the slit portion 7b', simply one light beam (one light beam as a sum of Ray 1 and Ray 2) propagates. An image of the slit group S1 is projected on the sample 50.

Furthermore, the third embodiment is different from the first embodiment in a method of guiding a plurality of light beams to the imaging element 9 in the detection optical system 8. In the present embodiment, before the light beam Ray 2 is incident on the detection lens system 8a, the light beam Ray 2 is reflected by the half mirror 8c so as to propagate on the same optical path as the path for the light beam Ray 1.

With the above-described configuration of the optical height detection apparatus according to the third embodiment, the light beam Ray 1 transmitted through the half mirror 8c on the detection side and the light beam Ray 2 reflected by the half mirror 8c propagate on the identical optical axis. Therefore, effectively equalizing the optical path length between the half mirror 7d on the projection side of the light beam Ray 1 and the half mirror 8c on the detection side, with the optical path length between the half mirror 7d on the projection side of the light beam Ray 2 and the half mirror 8c on the detection side enables the light beam Ray 1 and the light beam Ray 2 to be imaged on the identical imaging element 9 at substantially equal positions and equal magnification.

In the optical height detection apparatus according to the third embodiment, the optical path lengths of the light beams Ray 1 and Ray 2 are effectively equalized by using the prism-shaped optical path length correction member 30. FIG. 8B is a view illustrating details of the optical path length correction member 30 on the light source 7a side. The optical path length correction member 30 is a transparent member having a function of changing the propagation direction of light and a function of correcting the optical path length.

The light beam Ray 2 reflected by the half mirror 7d is incident substantially perpendicularly to the incident surface 30a of the optical path length correction member 30, then reflected by the reflection surface 30c to change the propagation direction, and is finally output substantially perpendicularly from the output surface 30b. The present embodiment illustrates, as an example of the simplest case, a case where the light beam Ray 2 is perpendicularly incident and output on/from the incident surface 30a and the output surface 30b respectively. Alternatively, however, it is allowable to use a configuration of the optical height detection apparatus in which the light beam Ray 2 and the incident surface 30a and the output surface 30b of the optical path length correction member 30 have inclination.

A feature of the present optical path length correction member 30 is to include at least one reflection surface 30c. It is desirable that the incident angle of the light beam Ray 2 with respect to the incident surface 30a be an angle that allows total reflection of the light beam Ray 2 on the reflection surface 30c. In other words, it is desirable that the light beam Ray 2 be incident on the optical path length correction member 30 such that an angle $\theta_R$ at which the light beam Ray 2 is incident on the reflection surface 30c is a critical angle or more.

For example, reflection by a metallic thin film involves a loss of light quantity, while total reflection on a reflection surface of a transparent member would be a reflection without loss of light quantity (reflection with reflectance of 100%). Note that while total reflection is used in the present embodiment, the optical path length correction member 30 may use an aluminum film to be applied as the reflection surface 30c. Application of the aluminum film as the reflection surface 30c would reduce the limitation of the angle at which the light beam is incident on the reflection surface 30c, leading to an increase in the degree of freedom of design.

The distance of propagation of light in the optical path length correction member 30 is OP1+OP2 illustrated in FIG. 8B. Accordingly, using Formula (3) to design the length of OP1+OP2 so that the optical path lengths of the light beams Ray 1 and Ray 2 between the half mirror 7d on the projection side and the half mirror 8c on the detection side are effectively equalized would achieve an effect similar to the effect described in the first and second embodiments.

In the present embodiment, the length OP1+OP2 is set such that an optical path length $OP_{R1}$ from the projection side half mirror 7d to the sample 50 at the position L1 is effectively equal to an optical path length $OP_{R2}$ from the projection side half mirror 7d to the sample 50 at the position L2. (Refer to FIG. 8C for $OP_{R1}$ and $OP_{R2}$) That is, the thickness $d_P$ corresponding to the length OP1+OP2 may be calculated by using $\Delta=|OP_{R1}-OP_{R2}|$ in Formula (3). With such a configuration, the optical path length up to the sample 50 is effectively equalized in the cases where the sample 50 is at the positions L1 and L2.

The similar configuration can be applied to the sample 50 from the detection optical system 8. Specifically, as illustrated in FIG. 8A, the optical path length correction member 30 and the half mirror 8c designed as described above (designed on the basis of the optical path between the projection side half mirror 7d and the sample 50) is also disposed on the detection side (at a position inversely symmetrical with respect to the optical axis EOA of the electron optical system). With this configuration of the optical height detection apparatus as described above, it is possible to effectively equalize the optical path lengths of the light beams Ray 1 and Ray 2 between the half mirror 7d on the projection side and the half mirror 8c on the detection side. As a result, the light beams Ray 1 and Ray 2 are imaged at substantially equal positions at equal magnification.

The present disclosure is not limited to the above-described exemplary embodiments, but may include various types of modification. For example, the above-described exemplary embodiments give detailed explanation just to allow the present disclosure to be clearly understood. Therefore, the present invention is not limited to the case having all of components in the configuration. In addition, a portion of configuration of an exemplary embodiment can be replaced with a portion of configuration of another exemplary embodiment. A portion or the configuration of another exemplary embodiment can be added to a certain exemplary embodiment. Moreover, regarding the portions of the configuration of each of the exemplary embodiments, addition, deletion, and replacement from another configuration would be possible.

What is claimed is:

1. A height detection apparatus configured to project a pattern on a sample arranged at any of a plurality of reference positions and configured to detect a height of the sample from the reference position on the basis of the pattern reflected from the sample, the apparatus comprising:
   a projection optical system that generates a plurality of spatially separated light beams each having the pattern and projects the generated spatially separated light beams onto the sample;
   an imaging element that images the pattern reflected from the sample;
   a detection optical system that guides the pattern reflected from the sample to the imaging element; and
   at least one optical path length correction member disposed on an optical path different from an optical path having a shortest optical path length among a plurality of optical paths corresponding to the plurality of light beams at a position where the plurality of light beams is spatially separated.

2. The height detection apparatus according to claim 1, wherein
the detection optical system outputs light beams incident from the plurality of optical paths toward the one imaging element.

3. The height detection apparatus according to claim 1, wherein
the projection optical system generates a light beam having the pattern by a slit group including a plurality of slits.

4. The height detection apparatus according to claim 1, wherein
the projection optical system generates the plurality of light beams by using a slit.

5. The height detection apparatus according to claim 1, wherein
the projection optical system separates and generates the plurality of light beams by using a half mirror.

6. The height detection apparatus according to claim 2, wherein
the detection optical system includes a wedge substrate.

7. The height detection apparatus according to claim 1, wherein
the optical path length correction member is formed of a transparent material and has an incident surface and an output surface parallel to each other.

8. The height detection apparatus according to claim 1, wherein
the optical path length correction member is a prism formed of a transparent material and having a reflection surface.

9. The height detection apparatus according to claim 7, wherein
the optical path length correction member is a glass rod.

10. The height detection apparatus according to claim 1, wherein
an optical path length $d_P$ of a light beam propagating in the optical path length correction member is calculated by the following Formula in a case where an optical path difference between an optical path having the shortest optical path length and an optical path in which the optical path length correction member is arranged is $\Delta$.

[Mathematical Formula 1]

$$d_P = \Delta \Big/ \left(1 - \frac{1}{n_L}\right)$$

11. The height detection apparatus according to claim 1, wherein
the optical path length correction members are disposed at a position on the projection optical system side with respect to the sample and at a position on the detection optical system side with respect to the sample.

12. A charged particle beam apparatus including the height detection apparatus according to claim 1.

* * * * *